(12) United States Patent
Anderson et al.

(10) Patent No.: US 8,299,538 B2
(45) Date of Patent: Oct. 30, 2012

(54) DIFFERENTIAL NITRIDE PULLBACK TO CREATE DIFFERENTIAL NFET TO PFET DIVOTS FOR IMPROVED PERFORMANCE VERSUS LEAKAGE

(75) Inventors: Brent A. Anderson, Jericho, VT (US); Suk Hoon Ku, Beacon, NY (US); Edward J. Nowak, Essex Junction, VT (US)

(73) Assignee: Interantional Business Machines Corporation, Armonk, NY (US)

(*) Notice: Subject to any disclaimer, the term of this patent is extended or adjusted under 35 U.S.C. 154(b) by 131 days.

(21) Appl. No.: 12/859,903

(22) Filed: Aug. 20, 2010

(65) Prior Publication Data
US 2010/0314688 A1 Dec. 16, 2010

Related U.S. Application Data

(62) Division of application No. 12/132,798, filed on Jun. 4, 2008, now Pat. No. 7,838,355.

(51) Int. Cl.
*H01L 21/70* (2006.01)

(52) U.S. Cl. ............. 257/369; 257/288; 257/E21.633; 257/E21.636; 257/E21.642

(58) Field of Classification Search .......... 257/288, 257/369; 438/199
See application file for complete search history.

(56) References Cited

U.S. PATENT DOCUMENTS

| | | | |
|---|---|---|---|
| 6,190,952 B1 * | 2/2001 | Xiang et al. ............... 438/155 |
| 6,319,794 B1 | 11/2001 | Akatsu et al. | |
| 6,323,532 B1 | 11/2001 | Joachim et al. | |
| 6,818,526 B2 | 11/2004 | Mehrad et al. | |
| 6,930,018 B2 | 8/2005 | Mehrad et al. | |
| 7,611,952 B2 * | 11/2009 | Suzuki ................... 438/303 |
| 2002/0190331 A1 * | 12/2002 | Wylie .................... 257/395 |
| 2006/0086987 A1 * | 4/2006 | Chen et al. .............. 257/369 |
| 2006/0099745 A1 | 5/2006 | Hsu et al. | |
| 2007/0069293 A1 | 3/2007 | Kavalieros et al. | |
| 2007/0096149 A1 * | 5/2007 | Liu et al. ................ 257/192 |
| 2007/0238242 A1 * | 10/2007 | Ting et al. ............... 438/230 |
| 2008/0014688 A1 * | 1/2008 | Thean et al. ............ 438/197 |
| 2008/0179638 A1 * | 7/2008 | Dyer et al. .............. 257/288 |
| 2009/0243029 A1 | 10/2009 | Anderson et al. | |
| 2010/0038728 A1 | 2/2010 | Anderson et al. | |
| 2010/0041199 A1 | 2/2010 | Anderson et al. | |

OTHER PUBLICATIONS

Anderson et al., U.S. Appl. No. 12/132,798, Office Action Communication, Mar. 29, 2010, 5 pages.
Anderson et al., U.S. Appl. No. 12/132,798, Notice of Allowance, Jul. 14, 2010, 4 pages.

* cited by examiner

*Primary Examiner* — A. Sefer
(74) *Attorney, Agent, or Firm* — Gibb & Riley, LLC; Richard M. Kotulak, Esq.

(57) ABSTRACT

Disclosed are embodiments of an integrated circuit structure with field effect transistors having differing divot features at the isolation region-semiconductor body interfaces so as to provide optimal performance versus stability (i.e., optimal drive current versus leakage current) for logic circuits, analog devices and/or memory devices. Also disclosed are embodiments of a method of forming the integrated circuit structure embodiments. These method embodiments incorporate the use of a cap layer pullback technique on select semiconductor bodies and subsequent wet etch process so as to avoid (or at least minimize) divot formation adjacent to some but not all semiconductor bodies.

15 Claims, 10 Drawing Sheets

DIFFERENTIAL NITRIDE PULLBACK TO CREATE DIFFERENTIAL NFET TO PFET DIVOTS FOR IMPROVED PERFORMANCE VERSUS LEAKAGE

CROSS-REFERENCE TO RELATED APPLICATIONS

This application is a Division of U.S. application Ser. No. 12/132,798 filed Jun. 4, 2008 U.S. Pat. No. 7,838,355, issued Nov. 23, 2010, the complete disclosure of which, in its entirety, is herein incorporated by reference.

BACKGROUND

1. Field of the Invention

The embodiments of the invention generally relate to integrated circuit structures and, more particularly, to an integrated circuit structure that incorporates a plurality of field effect transistors (FETs) at least one of which is formed with a nitride pullback technique to avoid divot formation at the channel width edges.

2. Description of the Related Art

Integrated circuit structures are often designed with trade-offs between performance and stability (i.e., between drive current and leakage current). For example, analog circuits may benefit more from stability than enhanced drive current. Contrarily, high power memory circuits (e.g., high power static random access memory (SRAM) arrays) may benefit more from enhanced drive current and capacitance than stability. In some circuits, such as high power logic circuits, this trade off may be at the transistor level and may differ for n-type field effect transistors (NFETs) as opposed to p-type field effect transistors (PFETs).

SUMMARY OF THE INVENTION

Disclosed herein are embodiments of an integrated circuit structure with field effect transistors having differing divot features at the isolation region-semiconductor body interfaces so as to provide optimal performance versus stability (i.e., optimal drive current versus leakage current).

One embodiment of the integrated circuit structure of the present invention comprises a substrate with first and second transistors for a logic circuit on that substrate. The first and second transistors can have different conductivity types (e.g., can be n-type and p-type transistors, respectively). The first transistor can comprise a first semiconductor body having a first sidewall. A first isolation region can be positioned adjacent to the first sidewall. This first isolation region can have either a first divot or no divot adjacent to the upper portion (i.e., the first upper portion) of the first sidewall. The second transistor can comprise a second semiconductor body having a second sidewall. A second isolation region can be positioned adjacent to the second sidewall. This second isolation region can have a second divot adjacent to the upper portion (i.e., the second upper portion) of the second sidewall. However, in the case of the second transistor, the second divot can be larger in size (i.e., have a greater depth) than the first divot, if any, in the first isolation region.

Another embodiment of the integrated circuit structure of the present invention comprises the logic circuit with the first and second transistors, as described in detail above. Additionally, this embodiment of the integrated circuit structure can also comprise a plurality of analog devices also on the substrate. These analog devices can comprise third and fourth transistors. The third and fourth transistors can have different conductivity types (e.g., can be n-type and p-type transistors, respectively) and can be configured in the same manner as the first transistor in the logic circuit. That is, the third transistor can comprise a third semiconductor body having a third sidewall. A third isolation region can be positioned adjacent to the third sidewall. This third isolation region can have either a third divot or not divot adjacent to the upper portion (i.e., third upper portion) of the third sidewall. Similarly, the fourth transistor can comprise a fourth semiconductor body having a fourth sidewall. A fourth isolation region can be positioned adjacent to the fourth sidewall. This fourth isolation region can have either a fourth divot or no divot adjacent to the upper portion (i.e., fourth upper portion) of the fourth sidewall. In this case, the first, third and fourth divots can all be approximately equal in size (i.e., can have approximately equal depths that are less than the depth of the second divot).

Yet another embodiment of the integrated circuit structure of the present invention comprises the logic circuit with the first and second transistors, as described in detail above. This embodiment can, optionally, comprise the analog devices, including the fourth and fifth transistors, as described in detail above. Additionally, this embodiment can comprise a memory circuit comprising fifth and sixth transistors. The fifth and sixth transistors can have different conductivity types (e.g., can be n-type and p-type transistors, respectively) and can be configured in the same manner as the second transistor of the logic circuit. That is, the fifth transistor can comprise a fifth semiconductor body having a fifth sidewall. A fifth isolation region can be positioned adjacent to the fifth sidewall. This fifth isolation region can have a fifth divot adjacent to the upper portion (i.e., the fifth upper portion) of the fifth sidewall. Similarly, the sixth transistor can comprise a sixth semiconductor body having a sixth sidewall. A sixth isolation region can be positioned adjacent to the sixth sidewall. This sixth isolation region can have a sixth divot adjacent to the upper portion (i.e., sixth upper portion) of the sixth sidewall. In this case, the second, fifth and sixth divots can all be approximately equal in sizes (i.e., can have approximately equal depths that are greater than the depth of the first divot).

Also disclosed are embodiments of a method of forming the integrated circuit structure embodiments, as described above. These method embodiments incorporate the use of a cap layer pullback technique on select semiconductor bodies and subsequent wet etch process so as to avoid (or at least minimize) divot formation adjacent to some but not all semiconductor bodies.

One embodiment the method of the present invention relates particularly to the formation of a logic circuit. This embodiment comprises patterning a first insulator layer-semiconductor layer stack to form, on a substrate, a first semiconductor body, having a first sidewall and a first cap layer, and a second semiconductor body, having a second sidewall and a second cap layer. Next, edge portions of the first cap layer on the first semiconductor body are selectively removed to expose upper edges of the first semiconductor body, while leaving the second cap layer intact. Then, a second insulator layer that is different from the first insulator layer is deposited to form a first isolation region adjacent to the first sidewall and also a second isolation region adjacent to the second sidewall.

After the second insulator layer is deposited, a planarization process is performed to expose the top surfaces of the remaining portions of the first insulator layer (i.e., to expose the top surface of the remaining portion of the first cap layer and also to expose the top surface of the second cap layer). Then, a wet etch process is performed in order to selectively remove the exposed first insulator layer from above the first and second semiconductor bodies. As a result, the upper corners of the first semiconductor body remain protected by the second insulator layer. This protection ensures that with subsequent processing, divot formation in the first isolation region adjacent to the first sidewall will be minimized. That is, this protection ensures that with subsequent processing either a first divot or no divot is formed in the first isolation region and that a second divot, having a greater depth than the first divot, if any, is formed in the second isolation region.

An additional embodiment of the method of the present invention relates to the formation of a logic circuit as well as the formation of analog devices and/or a memory circuit. This embodiment of the method comprises patterning a first insulator layer-semiconductor layer stack to form, on a substrate, a plurality of semiconductor bodies each having sidewalls and a cap layer. Next, portions of the cap layer are selectively removed from the semiconductor bodies in a first group to expose the upper edges of those semiconductor bodies, while leaving the cap layer intact on the semiconductor bodies in a second group. Then, a second insulator layer that is different from the first insulator layer is deposited to form isolation regions adjacent to the sidewalls of all of the semiconductor bodies.

After the second insulator layer is deposited, a planarization process is performed to expose the top surfaces of the remaining portions of the first insulator layer (i.e., to expose the cap layers on all of the semiconductor bodies). Then, a wet etch process is performed in order to selectively remove the exposed first insulator layer from above the semiconductor bodies. As a result, the upper corners of the semiconductor bodies in the first group remain protected by the second insulator layer. This protection ensures that with subsequent processing, divot formation in the isolation regions adjacent to the sidewalls of the semiconductor bodies in the first group will be minimized. That is, this protection ensures that with subsequent processing either relatively small divots or no divots are formed in the isolation regions adjacent to the sidewalls of the semiconductor bodies in the first group and that relatively large second divots (i.e., divots having a greater depth) are formed in the isolation regions adjacent to the sidewalls of the semiconductor bodies in the second group. Finally, different conductivity type transistors for a logic circuit as well as for analog devices and/or a memory circuit are formed on the substrate using semiconductor bodies from the different groups.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION OF THE INVENTION

The embodiments of the invention and the various features and advantageous details thereof are explained more fully with reference to the non-limiting embodiments that are illustrated in the accompanying drawings and detailed in the following description.

As mentioned above, integrated circuit structures are often designed with trade-offs between performance and stability (i.e., between drive current and leakage current). For example, analog circuits may benefit more from stability than enhanced drive current. Contrarily, high power memory circuits (e.g., high power static random access memory (SRAM) arrays) may benefit more from enhanced drive current and capacitance than stability. In some circuits, such as high power logic circuits, this trade off may be at the transistor level and may differ for n-type field effect transistors (NFETs) as opposed to p-type field effect transistors (PFETs).

Figure 1A:
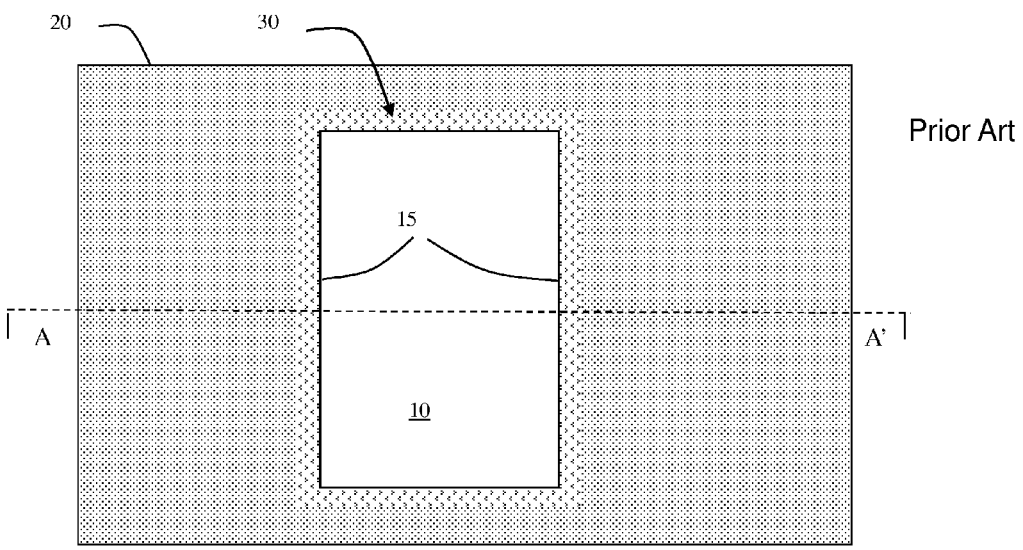
FIGS. 1A-1B are top view and cross-section diagrams, respectively, illustrating isolation region divot formation during conventional field effect transistor (FET) processing.
Figure 1B:
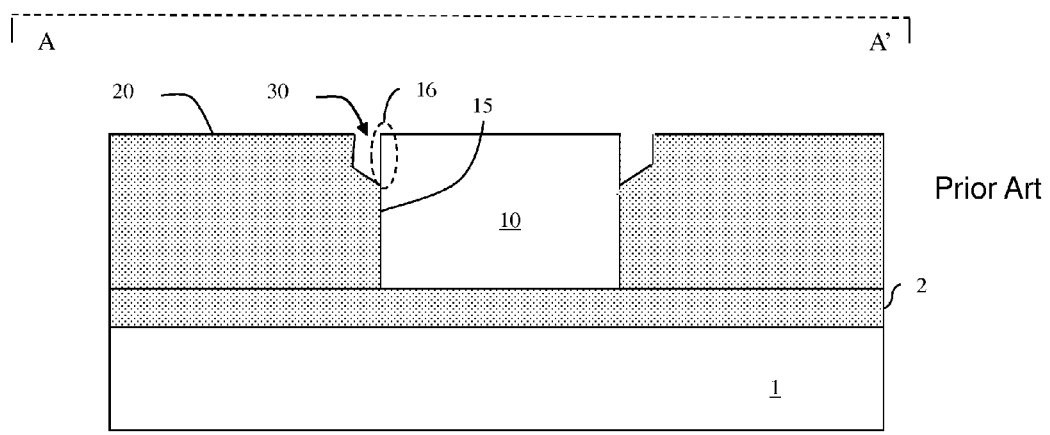

More particularly, referring to FIGS. 1A-1B, one problem inherent in conventional planar field effect transistors (FETs) processing is divot 30 formation in the isolation regions 20. Specifically, in conventional FET processing a nitride layer-semiconductor layer stack is formed on a substrate 1. The stack is patterned to form a plurality of parallel semiconductor bodies 10, each having sidewalls 15 and a cap layer. Then, isolation regions 20 are formed adjacent to the sidewalls 15 of the semiconductor bodies 10. Subsequent processing (e.g., chemical mechanical polishing (CMP) of the cap layer, resist strips, cleaning, etc.) inevitably causes divots 30 in the isolation regions 20 and, particularly, at the isolation region-semiconductor body interfaces. These divots 30 expose the upper portions 16 of the semiconductor body sidewalls 15.

Figure 2A:
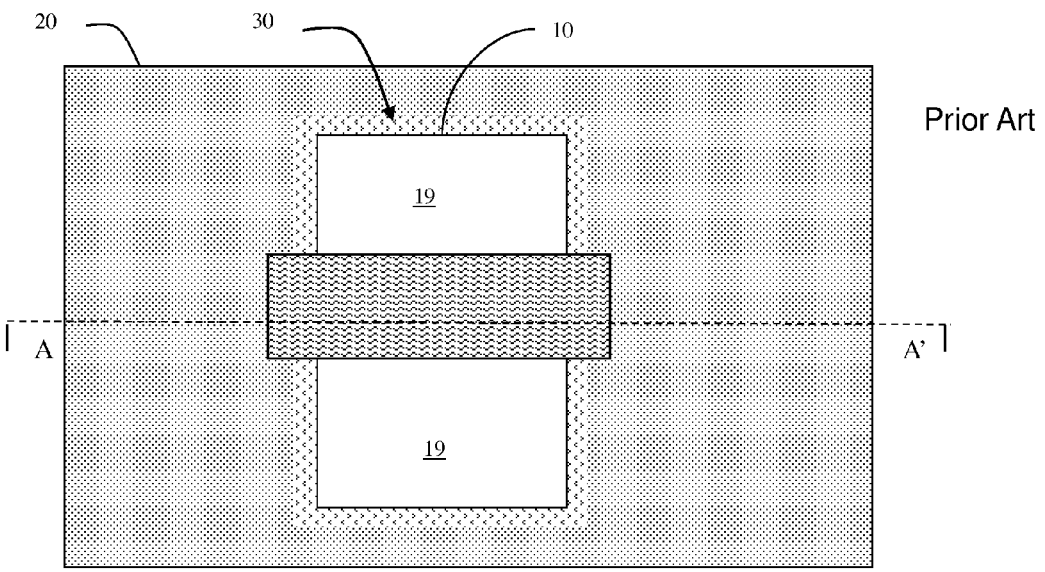
FIGS. 2A-2B are top view and cross-section diagrams, respectively, illustrating vertical gate formation within isolation region divots during conventional FET processing.
Figure 2B:
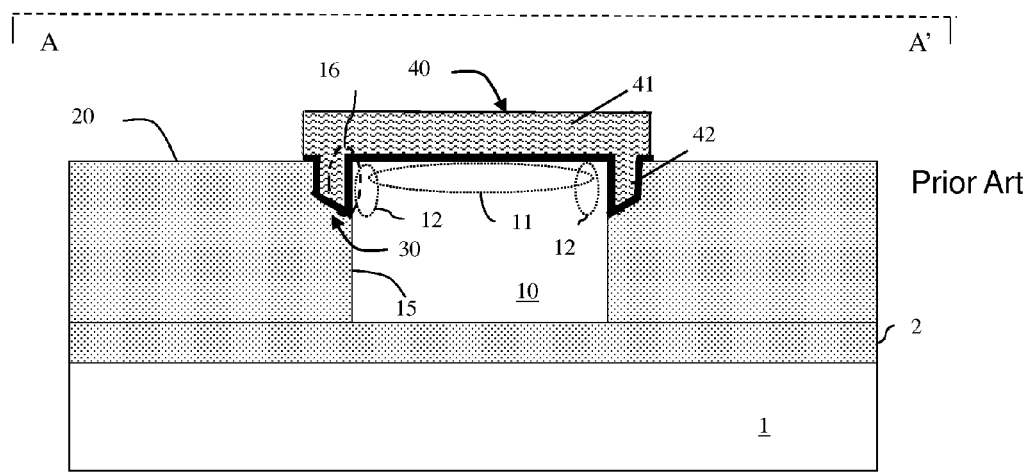

Referring to FIGS. 2A-2B, following the formation of the isolation regions 20, a gate structure 40 is formed across the top surface of the center region of the semiconductor body 10. This gate structure 40 (including a gate dielectric layer and gate conductor) further fills in the divots 30. The top surface of the semiconductor bodies 10 in the end regions are implanted with appropriate dopants to form source/drain regions 19 and, optionally, source/drain extensions and halos for NFETs and PFETs. The horizontal portion 41 of the gate structure 40 in conjunction with the implanted source/drain dopants in the end regions define a horizontal channel region 11 at the top surface of the semiconductor body 10.

The divots 30 inevitably cause current leakage at the channel width edges in the resulting FETs and, thereby degrade stability. However, given semiconductor wafer structures and patterning techniques currently in use, the sidewall 15 will typically have a crystalline orientation with optimal mobility for holes (e.g., [110] orientation). Thus, in the case of a PFET, the vertical portion 42 of the gate structure 40 within the divot 30 adjacent to the upper portion 16 of the sidewall 15 will create a vertical channel region 12 in the upper corner of the semiconductor body 10 and, thereby, enhance PFET drive current. In the case of an NFET, enhancement of drive current is minimal because the crystalline orientation of the sidewall 15 is not optimal for electron mobility.

In some circuits (e.g., high power static random access memory (SRAM) arrays), the enhanced drive current in both the PFETs and NFETs balances out any loss in stability. In some circuits (e.g., in a high power logic circuit), the significantly enhanced PFET drive current will outweigh the loss in stability. However, the only minimally enhanced NFET drive current will not. In yet other circuits (e.g., analog circuits), the need for stability is paramount and the enhanced drive current, regardless of how great, does not outweigh the need for stability. Therefore, there is a need in the art for an integrated circuit structure and method of forming the integrated circuit structure with field effect transistors having differing divot features at the isolation region-semiconductor body interfaces so as to provide circuit-type dependent optimal performance versus stability (i.e., optimal drive current versus leakage current).

Therefore, disclosed herein are embodiments of an integrated circuit structure with field effect transistors having differing divot features at the isolation region-semiconductor body interfaces so as to provide circuit-type dependent optimal performance versus stability (i.e., optimal drive current versus leakage current). More particularly, referring to FIGS. 3A-D in combination, each of the embodiments of the integrated circuit structure 1000 of the present invention comprises a substrate 1001 and an isolation layer 1002 (e.g., a buried oxide layer or other suitable isolation layer) above the substrate 1001. Additionally, the integrated circuit structure 1000 can comprise a first circuit 1100 (e.g., a high power logic circuit) above the isolation layer 1002. Optionally, the integrated circuit structure 1000 can also comprise a plurality of analog devices 1200, a memory circuit 1300 (e.g., a high power static random access memory (SRAM) array), and/or any other type of circuit that may benefit having transistors with differing divot features.

Figure 3A:
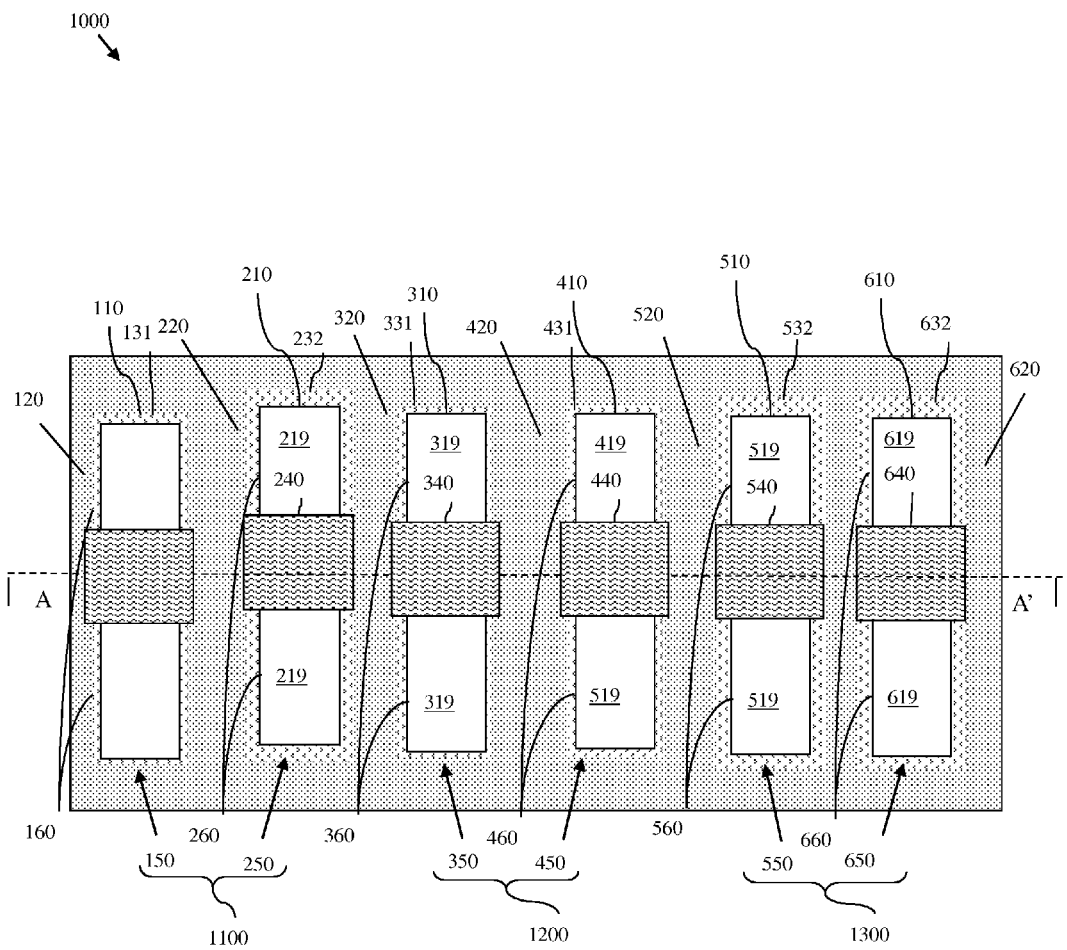
FIG. 3A is a top view diagram illustrating an embodiment of the integrated circuit structure 1000 of the present invention.
Figure 3B:
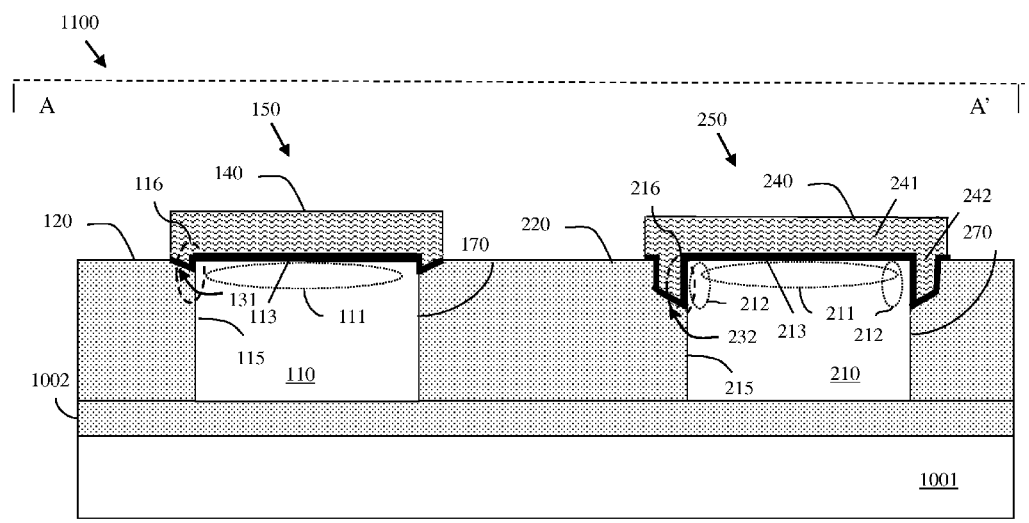
FIG. 3B is a cross-section view diagram illustrating structure 1100 of FIG. 3A.

Referring to FIG. 3B in combination with FIG. 3A, the logic circuit 1100 can comprise at least two transistors (i.e., a first transistor 150 and a second transistor 250) on the isolation layer 1002 above the substrate 1001. The first transistor 150 can comprise a first semiconductor body 110 having a first center region 170 (through cross section A-A'), first end regions 160, a first top surface 113, and first sidewalls 115. The first sidewalls 115 can have first upper portions 116. A first isolation region 120 can be positioned around the first semiconductor body 110 and, more specifically, adjacent to the first sidewalls 115. The first isolation region 120 can have either first divots 131 (as shown) or no divots adjacent to the first upper portions 116 of the first sidewalls 115. Specifically, during formation of this first transistor 150 (see method embodiments discussed in detail below), divot 131 formation in the first isolation region 120 at the interface between the first isolation region 120 and the first sidewalls 115 is minimized (or avoided altogether). Thus, the first gate 140 (including a gate dielectric layer and a gate conductor layer) of this first transistor 150 is positioned, on the first center region 170, adjacent to the first top surface 113 with little, if any, vertical gate features along the first sidewalls 115.

The second transistor 250 can similarly comprise a second semiconductor body 210 having a second center region 270, second end regions 260, a second top surface 213, and second sidewalls 215. The second sidewalls 215 can have second upper portions 216. A second isolation region 220 can be positioned around the second semiconductor body 210 and, more specifically, adjacent to the second sidewalls 215. The second isolation region 220 can have second divots 232 adjacent to the second upper portions 216 of the second sidewalls 215. These second divots 232 can be greater in size than the first divots 131, if any (i.e., the second divots 232 can have a greater depth than the first divots 131). Thus, a greater amount of the second upper portions 216 of the second sidewalls 215 of the second semiconductor body 210 are exposed than the first upper portions 116 of the first sidewalls 115 of the first semiconductor body 110). Specifically, during formation of this second transistor 250 (see method embodiments discussed in detail below), divot 232 formation in the second isolation region 220 at the interface between the second isolation region 220 and the second sidewalls 215 is allowed (i.e., promoted). Thus, the second gate 240 (including gate dielectric layer and gate conductor layer) of this second transistor 250 is positioned, on the second center region 270, adjacent to the second top surface 213 and also within the second divots 232 adjacent to the second upper portions 216 of the second sidewalls 215. That is, due to the promotion of divot 232 formation in the second isolation regions 220, the second gate 240 comprises vertical gate features 242 along the second sidewalls in addition to horizontal gate features 241 along the second top surface 213.

The first and second semiconductor bodies 110, 210 incorporated into the first and second transistors 150, 250, respectively, can be parallel and etched from the same semiconductor layer during transistor formation. Thus, the first and second sidewalls 115, 215 of the first and second semiconductor bodies 110, 210, respectively, will have the same crystalline orientation. For example, the first and second sidewalls can each have a crystalline orientation with a high mobility for holes (e.g., [110] orientation). In prior art logic structures without differential divot formation, NFET drive increase resulting from within divot vertical gate structures was offset by the capacitance increase resulting from such within divot vertical gate structures. That is, although there was an increase in the drive current, it was low due to the low sidewall mobility and this relatively low increase in drive current was offset by the resulting increase in capacitance such that the logic circuits exhibited power and performance degradation. However, since sidewall mobility for holes is high, the increase in drive current for PFETs is high enough so that it is not offset by the resulting increase in capacitance. Thus, with the present invention a high power logic circuit 1100 can be formed such that the first transistor 150 comprises an n-type field effect transistor (NFET) with relatively small first divots 131 or no divots and, thus, with effectively no vertical gate portions and further such that the second transistor 250 comprises a p-type field effect transistor (PFET) with relatively large divots 232 and, thus, with significant vertical gate portions 242.

Specifically, in a high power logic circuit 1100, any NFET drive current enhancement that might have resulted from a vertical gate portion within a divot would be minimal, due to the crystalline orientation of the first sidewall 115. The need for stability would outweigh such minimal drive current enhancement (i.e., minimal performance enhancement). Therefore, logic circuit NFETs are optimally formed, as the first transistor 150, without isolation region divots or with minimal isolation region divots 131. Thus, in the first transistors 150, the first end regions 160 of the first semiconductor body 110 comprise n-type source/drain dopants (e.g., arsenic (As), antimony (Sb) or phosphorous (P)). Optionally, these first end regions 160 can also comprise n-type source/drain extension dopants and p-type halo dopants (e.g., boron (B)). Implanting such source/drain dopants (and, optionally, such source/drain extension and halo dopants) through the first top surface 113 in the first end regions 160 creates an n-type transistor with a horizontal channel region 111 in the first center region 170 at the first top surface 113 adjacent to the first gate 140.

Contrarily, the PFET drive current enhancement (i.e., performance enhancement) that would result from a vertical gate portion within a divot, as in the second transistor 250, would be significant, due to the crystalline orientation of the second sidewall 215. This significant drive current enhancement would outweigh any stability degradation. Therefore, logic circuit PFETs are optimally formed, as the second transistor 250 with significant isolation region divots 232. Thus, in the second transistor 250, the second end regions 260 of the second semiconductor body 210 comprise p-type source/drain dopants (e.g., boron (B)). Optionally, the second end regions 260 can also comprise p-type source/drain extension dopants and n-type halo dopants. Implanting such source/drain dopants (and, optionally, such source/drain extension and halo dopants) through the second top surface 213 of the second semiconductor body 210 in the second end regions 260 creates a p-type transistor with a horizontal channel region 211 in the second center region 270 at the second top surface 213 adjacent to the horizontal portion 241 of the second gate 240. Implanting such source/drain dopants (and, optionally, such source/drain extension and halo dopants) into the second upper portions 216 of the second sidewalls 215 of the second semiconductor body 210 in the second end regions 260 (e.g., using an angled implant technique) further creates, in the p-type transistor, vertical channel regions 212 in the second center region 270 at the second upper portions 216 of the second sidewalls 215 adjacent to the vertical portions 242 of the second gate 240.

Figure 3C:
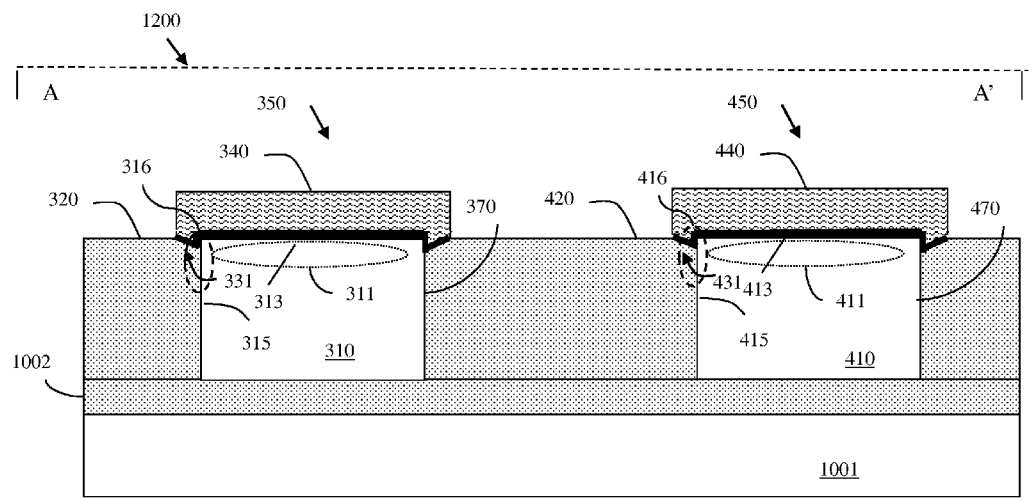
FIG. 3C is a cross-section view diagram illustrating structure 1200 of FIG. 3A.

Referring to FIG. 3C in combination with FIG. 3A, another embodiment of the integrated circuit 1000 of the present invention comprises the logic circuit 1100 on the isolation layer 1002 above the substrate 1001, as described in detail above. This embodiment further comprises a plurality of analog devices 1200 on the isolation layer 1002 above the substrate 1001. With analog devices 1200 stability is paramount over performance. Consequently, current leakage, which is due to divot formation and which degrades stability, is a concern and should be avoided. Therefore, the analog devices 1200 (e.g., either NFETs or PFETs) in this embodiment are configured in the same manner as the first transistor 150 of the logic circuit 1100.

Specifically, the analog devices 1200 can comprise a third transistor 350 (e.g., an n-type transistor) and a fourth transistor (e.g., a p-type transistor). The third transistor 350 can comprise a third semiconductor body 310 having a third center region 370, third end regions 360, a third top surface 313, and third sidewalls 315. The third sidewalls 315 can have third upper portions 316. A third isolation region 320 can be positioned around the third semiconductor body 310 and, more specifically, adjacent to both the third sidewalls 315. The third isolation regions 320 can have either third divots 331 (as shown) or no divots adjacent to the upper portions 316 (i.e., third upper portions) of the third sidewalls 315. That is, during formation of this third transistor 350, divot formation in the third isolation region 320 at the interface between the third isolation region 320 and the third sidewalls 315 is minimized (or avoided altogether). Thus, the third gate 340 (including a gate dielectric layer and a gate conductor layer) of this third transistor 350 is positioned, on the third center region 370, adjacent to the third top surface 313 with little, if any, vertical gate features along the third sidewalls 315. That is, due avoidance or minimization of divot formation, vertical gate features along the third sidewalls 315 are also avoided or minimized.

Similarly, the fourth transistor 450 can comprise a fourth semiconductor body 410 having a fourth center region 470, fourth end regions 460, a fourth top surface 413, and fourth sidewalls 415. The fourth sidewalls 415 can have first upper portions 416. A fourth isolation region 420 can be positioned around the fourth semiconductor body 410 and, more specifically, adjacent to both the fourth sidewalls 415. The fourth isolation regions 420 can have either fourth divots 431 (as shown) or no divots adjacent to the upper portions 416 (i.e., fourth upper portions) of the fourth sidewalls 415. That is, during formation of this fourth transistor 450, divot formation in the fourth isolation region 420 at the interface between the fourth isolation region 420 and the fourth sidewalls 415 is minimized (or avoided altogether). Thus, the fourth gate 440 (including a gate dielectric layer and a gate conductor layer) of this fourth transistor 450 is positioned, on the fourth center region 470, adjacent to the fourth top surface 413 with little, if any, vertical gate features along the fourth sidewalls 415. That is, due avoidance or minimization of divot formation, vertical gate features along the fourth sidewalls 415 are also avoided or minimized.

It should be noted that as mentioned above, the first divots 131, if any, the second divots 232 have different sizes (i.e., the second divots 232 have a greater depth). However, the first divots 131, third divots 331 and fourth divots 431, if any, can all have approximately equal sizes (i.e., can have approximately equal depths).

The semiconductor bodies 310, 410 incorporated into the transistors 350, 450 can be parallel and etched from the same semiconductor layer as the first and second semiconductor bodies 110, 210 during transistor formation. Thus, all of the sidewalls 115, 215, 315, 415 of all of the semiconductor bodies 110, 210, 310, 410 will have the same crystalline orientation (e.g., a crystalline orientation with a high mobility for holes, such as orientation). In this embodiment of the integrated circuit 1000, the first, third and fourth transistors 150, 350, and 450 are all configured the same, despite the fact that the first and third transistors 150, 350 have one conductivity type (e.g., are n-type transistors) and the fourth transistor 450 has a different conductivity type (e.g., is a p-type transistor).

As mentioned above, in the case of analog devices 1200 stability is paramount over drive current. Therefore, like the first transistor 150, the third and fourth transistors 350, 450 are formed such that divot formation at the isolation region-semiconductor body interfaces is minimized or avoided to improve stability. Consequently, like the first transistor 150, the third transistor 350 and the fourth transistor 450 have no vertical gate features or have minimal vertical gate features and, thus, like the first transistor 150, neither the third transistor 350, nor the fourth transistor 450 has vertical channel regions. That is, like the first transistor 150, the third and fourth transistors 350, 450 each only have a horizontal channel region 311, 411.

Figure 3D:
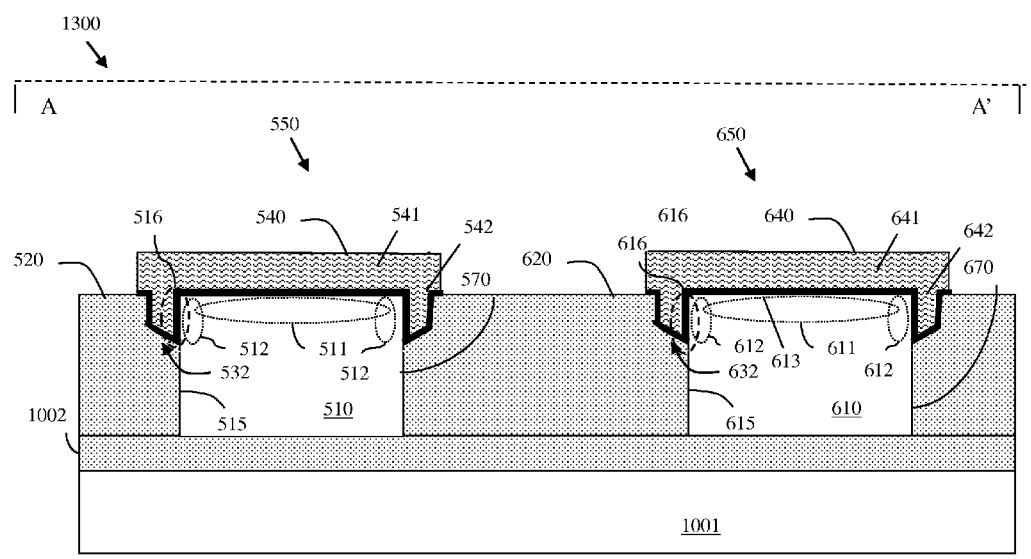
FIG. 3D is a cross-section view diagram illustrating structure 1300 of FIG. 3A.

Referring to FIG. 3D in combination with FIG. 3A, another embodiment of the integrated circuit 1000 of the present invention comprises the logic circuit 1100 on the isolation layer 1002 above the substrate 1001, as described in detail above. This embodiment also, optionally, comprises the analog devices 1200, as described in detail above. Additionally, this embodiment comprises a memory circuit 1300 (e.g., a high power static random access memory (SRAM) array) on the isolation layer 1002 above the substrate 1001. With high power SRAM arrays performance (i.e., drive current) and capacitance are paramount over stability. Consequently, memory circuit transistors and, particularly, high power SRAM transistors, should be configured to enhance drive current even if only by a minimal amount. Therefore, the memory circuit 1300 comprises transistors, both NFETs and PFETs, that are configured in the same manner as the second transistor 250 of the logic circuit 1100.

Specifically, the memory circuit 1300 can comprise at least a fifth transistor 550 (e.g., an n-type transistor) and a sixth transistor 650 (e.g., a p-type transistor). The fifth transistor 550 can comprise a fifth semiconductor body 510 having a fifth center region 570, fifth end regions 560, a fifth top surface 513, and fifth sidewalls 515. The fifth sidewalls 515 can have fifth upper portions 516. A fifth isolation region 520 can be positioned around the fifth semiconductor body 510 and, more specifically, adjacent to the fifth sidewalls 515. The fifth isolation region 520 can have fifth divots 532 adjacent to the fifth upper portions 516 of the fifth sidewalls 515. These fifth divots 532 can be greater in size than the first divots 131, if any (i.e., the fifth divots 232 can have a greater depth than the first divots 131) and can be approximately equal in size (i.e., in depth) to the second divots 232. Specifically, during formation of this fifth transistor 550 (see method embodiments discussed in detail below), divot 532 formation in the fifth isolation region 520 at the interface between the fifth isolation region 520 and the fifth sidewalls 515 is allowed (i.e., promoted). Thus, the fifth gate 540 (including gate dielectric layer and gate conductor layer) of this fifth transistor 550 is positioned, on the fifth center region 570, adjacent to the fifth top surface 513 and also within the fifth divots 532 adjacent to the fifth upper portions 516 of the fifth sidewalls 515. That is, due to the promotion of divot 532 formation, the fifth gate 540 comprises vertical gate features 542 along the fifth sidewalls 515 in addition to horizontal gate features 541 along the fifth top surface 513.

Similarly, the sixth transistor 650 can comprise a sixth semiconductor body 610 having a sixth center region 670, sixth end regions 660, a sixth top surface 613, and sixth sidewalls 615. The sixth sidewalls 615 can have sixth portions 616. A sixth isolation region 620 can be positioned around the sixth semiconductor body 610 and, more specifically, adjacent to the sixth sidewalls 615. The sixth isolation region 620 can have sixth divots 632 adjacent to the sixth upper portions 616 of the sixth sidewalls 615. These sixth divots 632 can be greater in size than the first divots 131, if any (i.e., the sixth divots 632 can have a greater depth than the first divots 131) and can be approximately equal in size to the second divots 232. Specifically, during formation of this sixth transistor 650 (see method embodiments discussed in detail below), divot 632 formation in the sixth isolation region 620 at the interface between the sixth isolation region 620 and the sixth sidewalls 615 is allowed (i.e., promoted). Thus, the sixth gate 640 (including gate dielectric layer and gate conductor layer) of this sixth transistor 650 is positioned, on the sixth center region 670, adjacent to the sixth top surface 613 and also within the sixth divots 632 adjacent to the sixth upper portions 616 of the sixth sidewalls 615. That is, due to the promotion of divot 632 formation, the sixth gate 640 comprises vertical gate features 642 along the sixth sidewalls 615 in addition to horizontal gate features 641 along the sixth top surface 613.

The semiconductor bodies 510, 610 incorporated into the transistors 550, 650 can be parallel and etched from the same semiconductor layer as the first and second semiconductor bodies 110, 210 during transistor formation. Thus, all of the sidewalls 115, 215, 515, 615 of all of the semiconductor bodies 110, 210, 510, 610 will have the same crystalline orientation (e.g., a crystalline orientation with a high mobility for holes, such as orientation). In this embodiment, the second, fifth and sixth transistors 250, 550, 650 are all configured the same, despite the fact that the fifth transistor 550 has one conductivity type (e.g., is an n-type transistor) and the second and sixth transistors 250, 650 have a different conductivity type (e.g., are p-type transistors). As mentioned above, in the case of memory circuits 1300 and, particularly, in the case of high power SRAM arrays, drive current and capacitance are paramount over stability. Specifically, increased capacitance in an SRAM helps stability. Adding vertical gate features will increase drive (significant in the case of a PFET and at least minimally in the case of an NFET) and also increase capacitance, thereby enhancing SRAM performance and stability. Therefore, for an SRAM 1300, like the second transistor 250, the fifth transistor 550 and sixth transistor 550 are formed such that divot formation at the isolation region-semiconductor body interfaces is optimized (e.g., promoted). That is, like the second transistor 250, the fifth and sixth transistors 550, 650 each have vertical gate features 542, 642 within isolation region divots 532, 632 in addition to horizontal gate features 541, 641 so as to create vertical channel regions 512, 612 at the upper portions 516, 616 of their respective semiconductor body sidewalls 515, 615 in addition to a horizontal channel region 511, 611 at the top surfaces 513, 613.

Also disclosed are embodiments of a method of forming the integrated circuit structure embodiments, as described above. These method embodiments incorporate the use of a cap layer pullback technique on select semiconductor bodies and subsequent wet etch process so as to avoid (or at least minimize) divot formation adjacent to some but not all semiconductor bodies.

Figure 4:
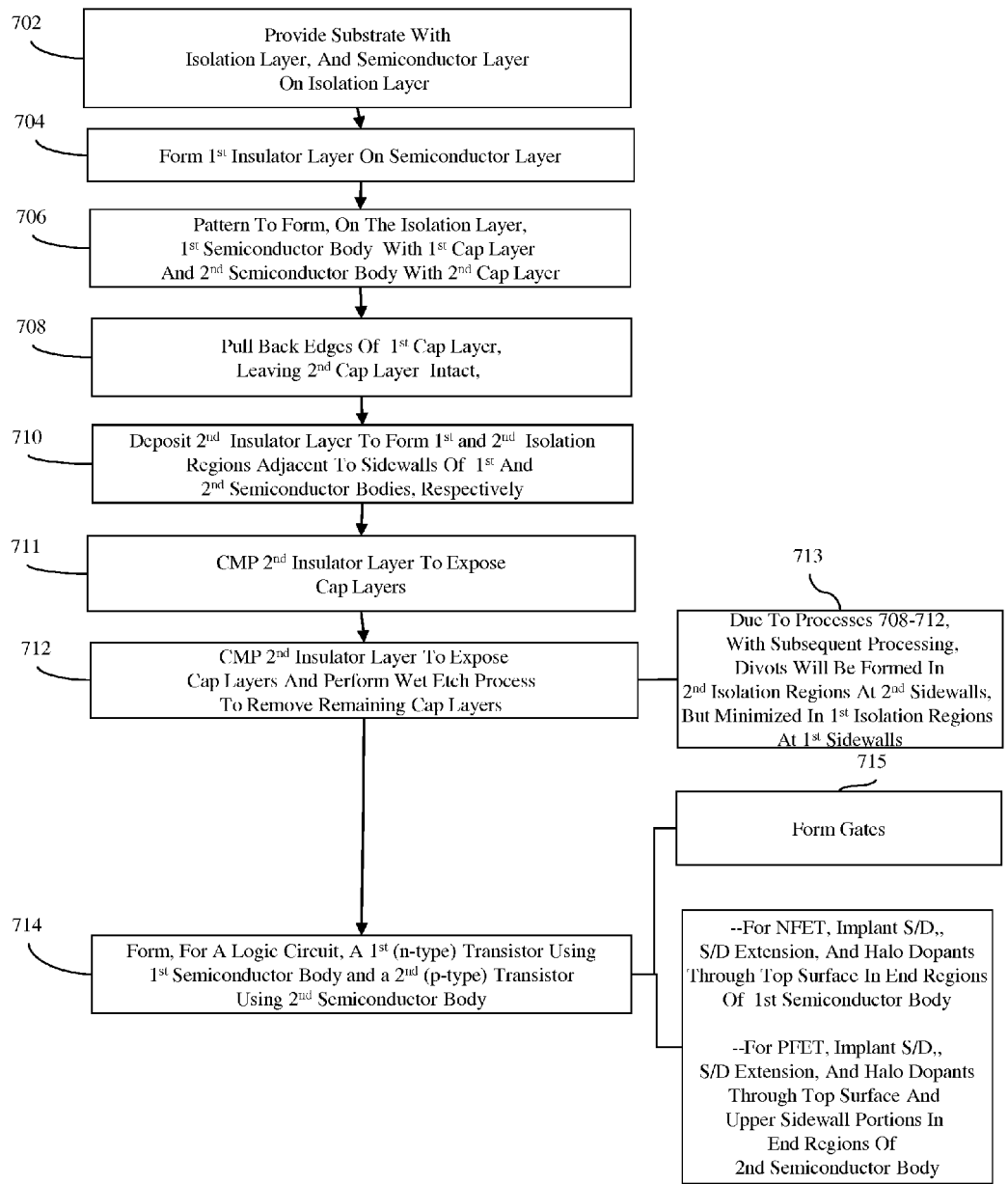
FIG. 4 is a flow diagram illustrating an embodiment of the method of the present invention.
Figure 5:
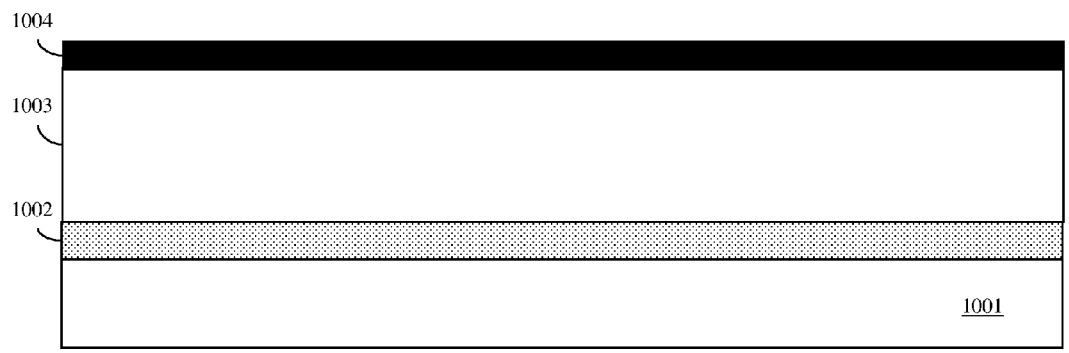
FIG. 5 is a cross-section diagram illustrating a partially completed integrated circuit structure 1000.

Referring to FIG. 4, one embodiment of the method of the present invention relates particularly to the formation of a logic circuit 1100. This embodiment comprises providing a substrate 1001 with an isolation layer 1002 and single crystalline semiconductor layer 1003 (e.g., a silicon layer, a silicon germanium layer, etc.) on the isolation layer 1002 (702, see FIG. 5). This substrate 1001 can, for example, comprise a bulk semiconductor wafer with an implanted isolation layer, a silicon-on-insulator (SOI) wafer, etc. A first insulator layer 1004 (e.g., a nitride layer or other insulator material that can be selectively etched over the isolation layer) is formed on the semiconductor layer 1003 (704, see FIG. 5).

Figure 6:
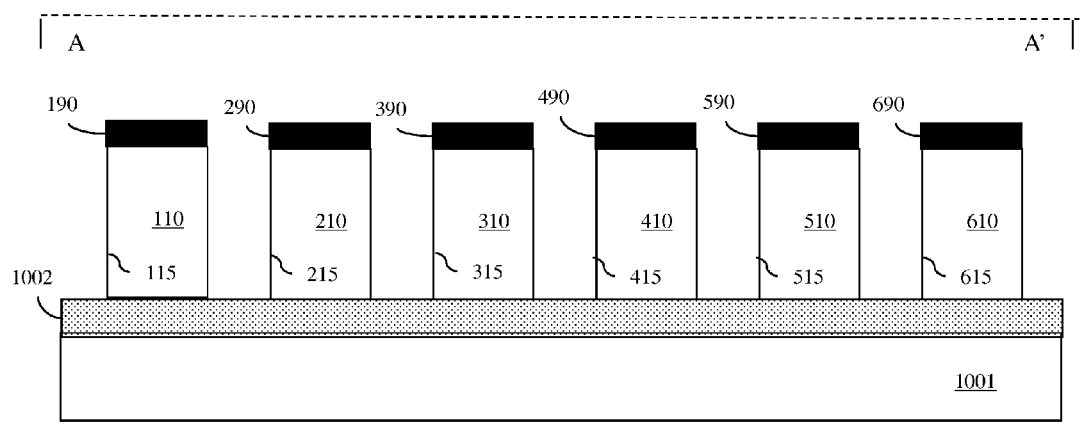
FIG. 6 is a cross-section diagram illustrating a partially completed integrated circuit structure 1000.

Next, the first insulator layer-semiconductor layer stack 1004-1003 is patterned to form, on the substrate 1001, a first semiconductor body 110, having first sidewalls 115 and a first cap layer 190, and a second semiconductor body 210, having second sidewalls 215 and a second cap layer 290 (706, see FIG. 6). It should be noted that the semiconductor layer 1003 is formed and the stack 1004-1003 is patterned (as discussed earlier) such that, after the patterning process, the first and second semiconductor bodies 110, 210 are parallel with the first and second sidewalls 115, 215 each having the same crystalline orientation (e.g., [110] with a high mobility for holes).

Figure 7:
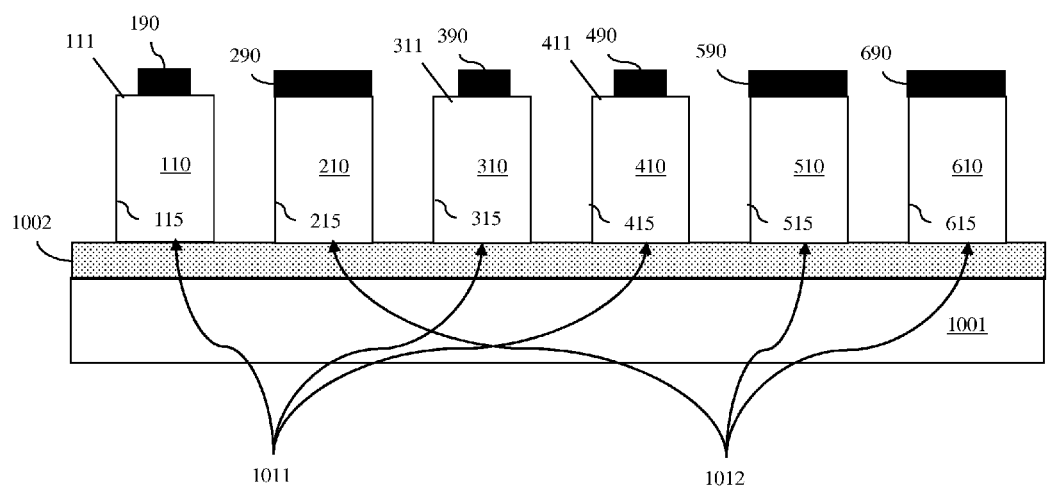
FIG. 7 is a cross-section diagram illustrating a partially completed integrated circuit structure 1000.

Next, edge portions of the first cap layer 190 are selectively removed (i.e., etched or pulled backed) to expose upper edges 111 of the first semiconductor body 110, leaving the second cap layer 290 on the second semiconductor body 210 intact (708, see FIG. 7). This process 708 can be accomplished, for example, by forming a mask (e.g., using lithographic patterning techniques) over second cap layer 290 as well as over the center portion of the first cap layer 190 such that the edge portions of the first cap layer 190 are exposed. Then, a directional etch process can be performed to removed the exposed edge portions.

After the edge portions of the first cap layer 190 are removed, a second insulator layer 1005 that is different from the first insulator layer 1004 (i.e., different from the material that formed the cap layers 190, 290) is deposited to form a first isolation region 120 adjacent to the first sidewalls 215 (i.e., surrounding the first semiconductor body 110) and a second isolation region 220 adjacent to the second sidewalls 215 (i.e., surrounding the second semiconductor body 210) (710). This second insulator layer 1005 can, for example, comprise a blanket oxide layer.

Figure 8:
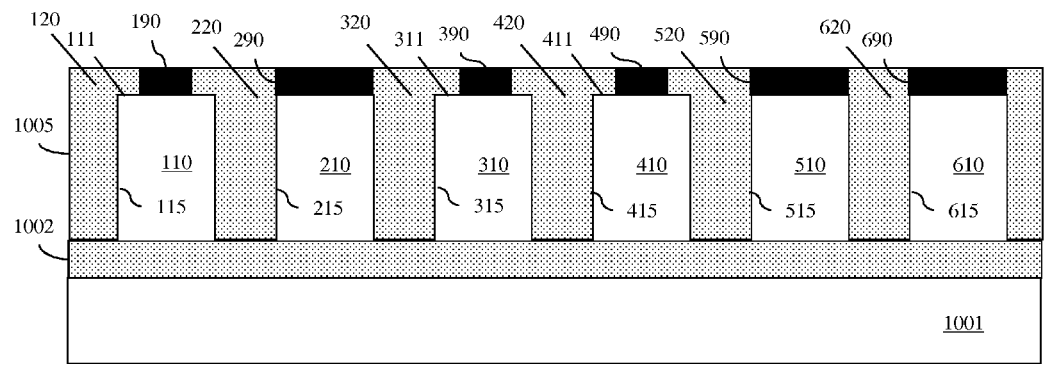
FIG. 8 is a cross-section diagram illustrating a partially completed integrated circuit structure 1000.
Figure 9:
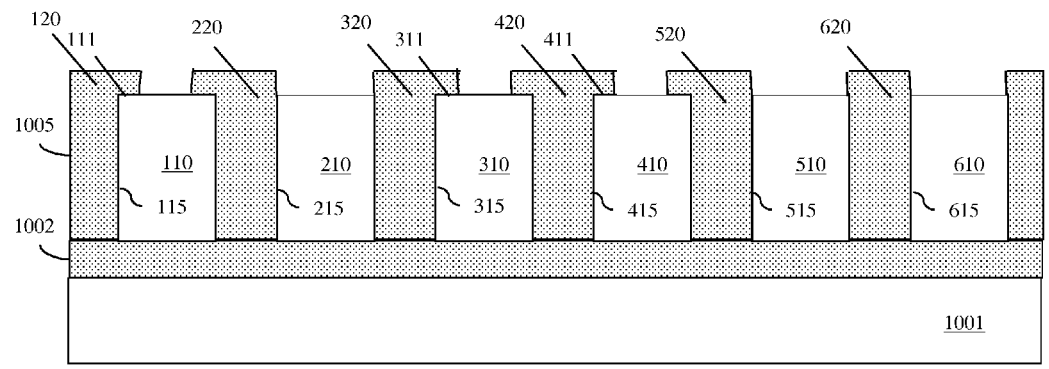
FIG. 9 is a cross-section diagram illustrating a partially completed integrated circuit structure 1000.
Figure 10:
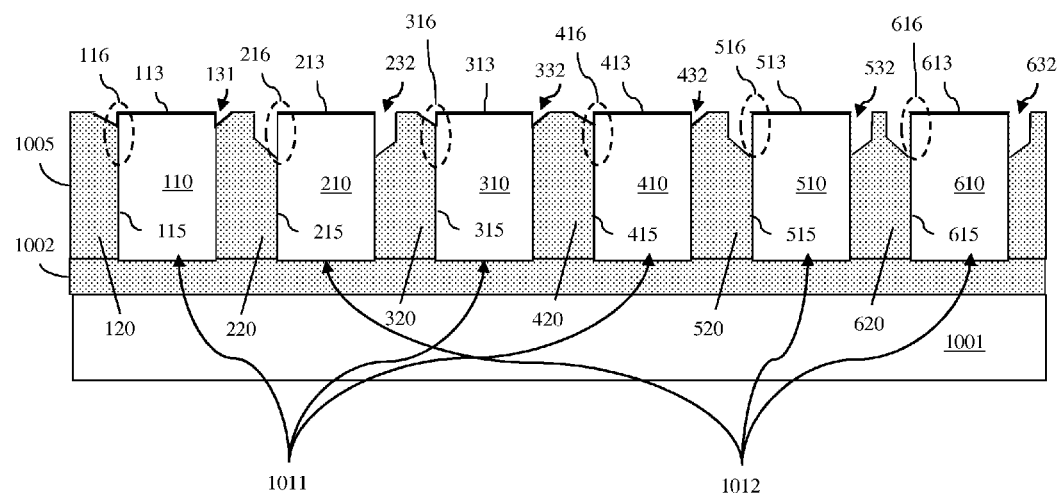
FIG. 10 is a cross-section diagram illustrating a partially completed integrated circuit structure 1000.

Subsequently, the second insulator layer 1005 is planarized in order to expose the top surfaces of the remaining portions of the first insulator layer 1004 (i.e., to expose the top surface of remaining cap layers 190, 290) (711, see FIG. 8). This planarization process is performed such that the cap layers 190, 290 are not removed. Then, a wet etch process is performed in order to selectively remove the exposed cap layers 190, 290 exposing the top surfaces 113, 213 of both the first and second semiconductor bodies 110, 210 and leaving the second isolation layer 1005 raised above the semiconductor bodies 110, 210 (712, see FIG. 9). As a result, the upper corners of the first semiconductor body 110 (i.e., the semiconductor body that had the cap layers 190 pulled back) remain protected by the second insulator layer 1005. This protection ensures that with subsequent processing (e.g., cleaning, FET processing, etc.), divot 131 formation in the first isolation region 120 adjacent to the first sidewall 115 will be minimized. That is, due to processes 708-712, the corners of the first semiconductor body 110 and not the second semiconductor body 210 are protected, thereby ensuring the following with subsequent processing that reduces the height of the second insulator layer 1005 (e.g., the STI oxide): (1) either a first divot 131 (as shown) or no divot is formed in the first isolation region 120 because of the additional material over the first semiconductor body corners and (2) a second divot 232, having a greater depth than the first divot 131, if any, is formed in the second isolation region 220 (713, see FIG. 10).

Following the wet etch process 712, different conductivity type transistors 150, 250 (e.g., n-type and p-type transistors) for a circuit 1100 (e.g., a high power logic circuit) are formed using the first and second semiconductor bodies 110, 210, respectively (714, see FIGS. 3A and 3B). Specifically, this process of forming different conductivity type transistors comprises forming gate structures 140, 240 that traverse the center regions of the first and second semiconductor bodies (715, see FIGS. 3A and 3B). These gate structures 140, 240 are formed simultaneously using conventional processing techniques. That is, a thin conformal gate dielectric layer (e.g., an oxide layer, a high K dielectric layer or a layer of some other suitable gate dielectric material) is deposited. This is followed by deposition of a gate conductor layer (e.g., a polysilicon layer or a layer of some other suitable gate conductor material). However, as a result of the divot 232 adjacent to the sidewalls 215 of the second semiconductor body 210, the gate structures 140, 240 will be different. That is, for a first transistor 150, a first gate 140 (including a gate dielectric layer and gate conductor layer) is formed adjacent to a first top surface 113 in a first center region 170 of the first semiconductor body 110. As there are minimal, if any, divot features 131 adjacent to the first semiconductor body 110, the first gate 140 is formed with minimal, if any, vertical gate features. At the same time, for a second transistor, a second gate 240 (including a gate dielectric layer and a gate conductor layer) is formed with a horizontal portion 241 adjacent to a second top surface 213 and with vertical portions 242 in the divots 232 adjacent to the second upper portions 216 of the second sidewalls 215 in the second center region 270 of the second semiconductor body 210.

The process of forming the different conductivity type transistors further comprises implanting appropriate dopants into the end regions 160, 260 of the semiconductor bodies 110, 210 to form source/drain regions 119, 219 and, optionally, source/drain extensions and/or halos (716). Specifically, n-type source/drain dopants (e.g., arsenic (As), antimony (Sb) or phosphorous (P)) are implanted through the first top surface 113 in first end regions 160 of the first semiconductor body 110 to form n-doped source/drain regions 219 in the first end regions. Optionally, n-type source/drain extension dopants and p-type halo dopants (e.g., boron (b)) can also be implanted through the first top surface 113 in the first end regions 160 to form n-doped source/drain extensions and p-doped halos in the first end regions 160. Forming the gate 140 and implanting such source/drain dopants (and, optionally, such source/drain extension and halo dopants) through the first top surface 113 in the first end regions 160 creates a horizontal channel region 111 in the first center region 170 of the first semiconductor body 110 at the first top surface 113 adjacent to the first gate 140.

Additionally, p-type source/drain dopants (e.g., boron (B)) can be implanted through the second top surface 213 and also through the second upper portion 216 of the second sidewalls 215 (e.g., using an angled implant process) in the second end regions 260 to form p-doped source/drain regions 219 in the second end regions 260. Optionally, p-type source/drain extension dopants and n-type halo dopants (e.g., arsenic (As), antimony (Sb) or phosphorous (P)) can also be implanted through the second top surface 213 and through the exposed second upper portions 216 of the second sidewalls 215 in the second end regions 260 to form n-doped source/drain extensions and p-doped halos in the second end regions 260. Forming the gate 240 with both horizontal and vertical portions 241-242 and implanting such source/drain dopants (and, optionally, such source/drain extension and halo dopants) through the second top surface 213 and through the exposed second upper portions 216 of the second sidewalls 215 creates, in the second center region 270 of the second semiconductor body 210, both a horizontal channel region 211 at the second top surface 213 adjacent to the horizontal portion 241 of the second gate 240 and vertical channel regions 212 at the second upper portions 216 of the second sidewalls 215 adjacent to the vertical portions 241 of the second gate 240.

Figure 11:
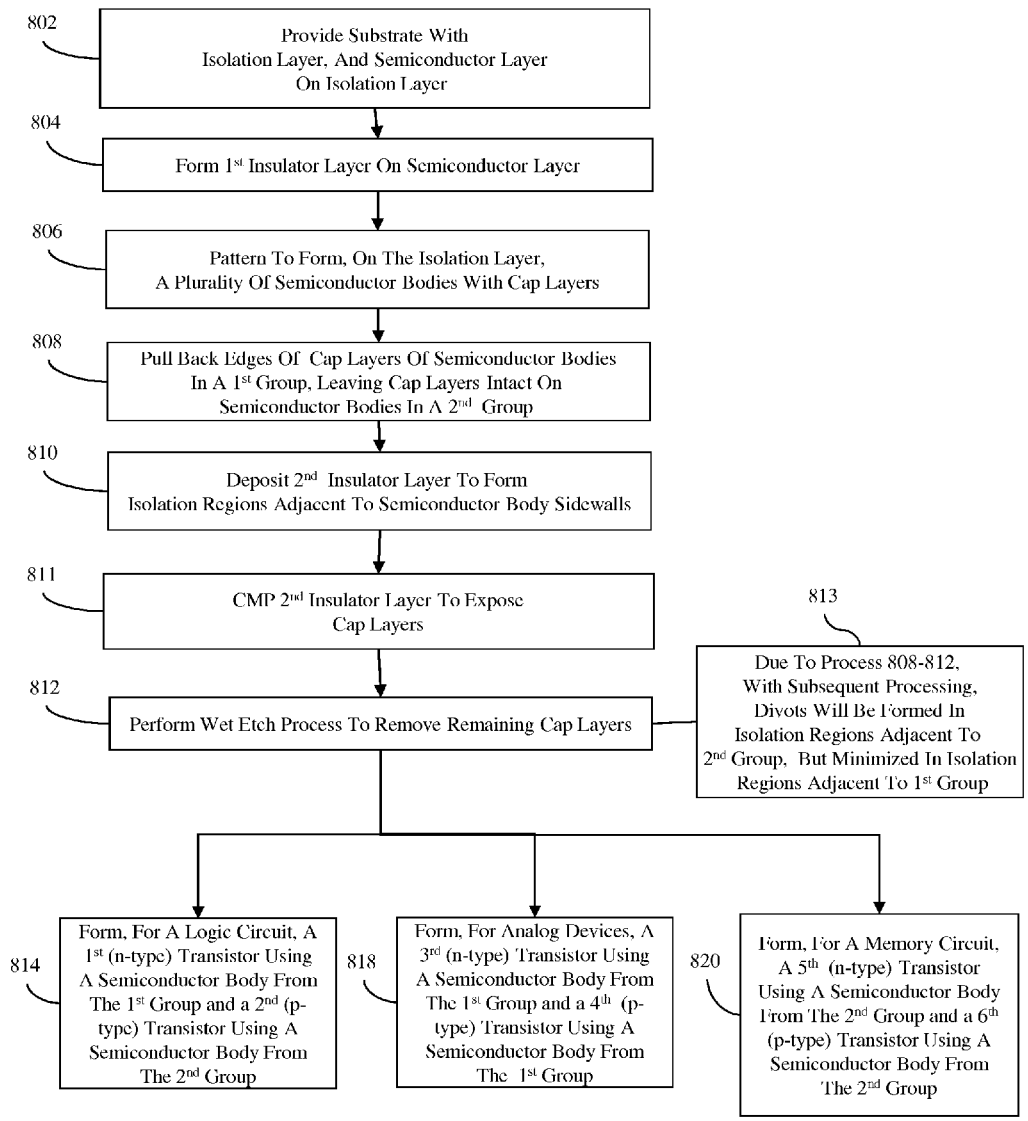
FIG. 11 is a flow diagram illustrating another embodiment of the method of the present invention.

Referring to FIG. 11, an additional embodiment of the method of the present invention relates to the formation of a logic circuit 1100 as well as the formation of analog devices 1200 and/or a memory circuit 1300. These embodiments similarly comprise providing a substrate 1001 with an isolation layer 1002 and single crystalline semiconductor layer 1003 (e.g., a silicon layer, a silicon germanium layer, etc.) on the isolation layer 1002 (802, see FIG. 5). This substrate 1001 can, for example, comprise a bulk semiconductor wafer with an implanted isolation layer, a silicon-on-insulator (SOI) wafer, etc. A first insulator layer 1004 (e.g., a nitride layer or other insulator material that can be selectively etched over the isolation layer) is formed on the semiconductor layer 1003 (804, see FIG. 5).

Next, the first insulator layer-semiconductor layer stack 1004-1003 is patterned to form, on the substrate 1001, a plurality of semiconductor bodies 110, 210, 310, 410, 510, 610, etc., each having sidewalls 115, 215, 315, 415, 515, 615 and a cap layer 190, 290, 390, 490, 590, 690 (806, see FIG. 6). It should be noted that the semiconductor layer 1003 is formed and the stack 1004-1003 is patterned (as discussed earlier) such that, after the patterning process, the semiconductor bodies 110, 210, 310, 410, 510, 610 are parallel and all have sidewalls 115, 215, 315, 415, 515, 615 with the same crystalline orientation (e.g., [110] with a high mobility for holes).

Next, this embodiment of the method comprises selectively removing (e.g., etching or pulling back) portions of the cap layer from each of the semiconductor bodies in a first group 1011 (e.g., see cap layers 190, 390 and 490 of the semiconductor bodies 110, 310 and 410) to expose the upper edges 111, 311, 411 of the semiconductor bodies 110, 310, 410 in that first group 1011, while leaving the cap layers intact on the semiconductor bodies in a second group 1012 (e.g., see intact cap layers 290, 590 and 690 on semiconductor bodies 210, 510 and 610) (808, see FIG. 7). This process 808 can be accomplished, for example, by forming a mask (e.g., using lithographic patterning techniques) over the cap layers 290, 590 and 690 of the second group 1012 as well as over the center portion of the cap layers 190, 390, 490 of the first group 1011 such that the outer edges of the cap layers 190, 390, 490 are exposed. Then, a directional etch process can be performed to removed the exposed cap layer edges.

After the edge portions of the cap layers 190, 390, 490 on the semiconductor bodies in the first group 1011 are removed at process 808, a second insulator layer 1005 that is different from the first insulator layer 1004 (i.e., that is different from the material that formed the cap layers) is deposited to form isolation regions 120, 220, 320, 420, 520, 620 adjacent to the sidewalls (e.g., 115, 215, 315, 415, 515, and 615) (810) This second insulator layer 1005 can, for example, comprise a blanket oxide layer.

Subsequently, the second insulator layer 1005 is planarized to expose the top surfaces of remaining portions of the first insulator layer 1004 (i.e., to expose the top surfaces of remaining cap layers 190, 290, 390, 490, 590, 690) (811, see FIG. 8). Then, a wet etch process is performed in order to remove the exposed cap layers 190, 290, 390, 490, 590, 690, thereby exposing the top surfaces 113, 213, 313, 413, 513 and 613 of all of the semiconductor bodies 110, 210, 310, 410, 510, 610 and leaving the second isolation layer 1005 raised above the semiconductor bodies 110, 210, 310, 410, 510, 610 (812, see FIG. 9). As a result, the upper corners of the semiconductor bodies 110, 310 and 410 in the first group 1011 remain protected by the second insulator layer 1005. This protection ensures that with subsequent processing (e.g., cleaning, FET processing, etc.), divot 131, 331, 431 formation in the isolation regions 120, 320, 420 adjacent to the sidewalls 115, 315, 415 of the semiconductor bodies 110, 310 and 410 in the first group 1011 will be minimized. That is, the corners of the semiconductor bodies in the first group 1011 and not the semiconductor bodies in the second group 1012 are protected, thereby ensuring the following with subsequent processing that reduces the height of the second insulator layer 1005 (e.g., the STI oxide): (1) either relatively small divots 131, 331, 431 or no divots are formed in the isolation regions 120, 320, 420 adjacent to the sidewalls 115, 315, 415 of the semiconductor bodies 110, 310, 410 in the first group 1011 and (2) relatively large divots 232, 532, 532 (i.e., divots having a greater depth) are formed in the isolation regions 220, 520, 620 adjacent to the sidewalls 215, 515, 615 of the semiconductor bodies 210, 510, 610 in the second group 1012 (813, see FIG. 10).

Following the wet etch process 812, different conductivity type transistors for one or more different types of circuits or devices (e.g., a high power logic circuit 1100, one or more analog devices 1200 and/or a memory circuit 1300 (e.g., a high power static random access memory (SRAM) array) may be formed using the semiconductor bodies 110, 210, 310, 410, 510, 610 in the first and second groups 1011, 1012 (814-818, see FIGS. 3A-3D).

Specifically, the method comprises forming, for a logic circuit 1100, a first (n-type) transistor 150 using a first semiconductor body 110 from the first group 1011 and a second (p-type) transistor 250 using a second semiconductor body 210 from the second group 1102 (814). Formation of the first and second transistors 150, 250 can be accomplished in the same manner, as described above at process 714-716. At essentially the same time, for analog devices 1200, a third (n-type) transistor 350 can be formed using a third semiconductor body 310 from the first group 1011 and a fourth (p-type) transistor 450 can be formed using a fourth semiconductor body 410 also from the first group 1011. Also at essentially the same time, for a memory circuit 1300, a fifth (n-type) transistor 550 can be formed using a fifth semiconductor body 510 from the second group 1012 and a sixth (p-type) transistor 650 can be formed using a sixth semiconductor body 610 also from the second group 1012.

It should be understood that the resulting integrated circuit chip 1000 can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed herein are embodiments of an integrated circuit structure with field effect transistors having differing divot features at the isolation region-semiconductor body interfaces so as to provide optimal performance versus stability (i.e., optimal drive current versus leakage current) for logic circuits, analog devices and/or memory devices. Also disclosed are embodiments of a method of forming the integrated circuit structure embodiments. These method embodiments incorporate the use of a cap layer pullback technique on select semiconductor bodies and subsequent wet etch process so as to avoid (or at least minimize) divot formation adjacent to some but not all semiconductor bodies.

What is claimed is:

1. An integrated circuit structure comprising:
   a substrate;
   a first transistor on said substrate, said first transistor comprising:
      a first semiconductor body having a first sidewall; and
      a first isolation region adjacent to said first sidewall, said first isolation region having a first divot positioned laterally immediately adjacent to a first upper portion of said first sidewall; and
   a second transistor on said substrate, said second transistor comprising:
      a second semiconductor body having a second sidewall; and
      a second isolation region adjacent to said second sidewall, said second isolation region having a second divot positioned laterally immediately adjacent to a second upper portion of said second sidewall, said second divot having a greater depth than said first divot.

2. The integrated circuit structure according to claim 1, said first transistor comprising an n-type transistor.

3. The integrated circuit structure according to claim 1, said second transistor comprising a p-type transistor.

4. The integrated circuit structure according to claim 1, said first sidewall and said second sidewall each having a same crystalline orientation.

5. The integrated circuit structure according to claim 1, further comprising:
   a first horizontal channel region at a first top surface of said first semiconductor body;
   a first gate adjacent to said first top surface;
   a second horizontal channel region at a second top surface of said second semiconductor body;
   a second vertical channel region at a second upper portion of said second sidewall of said second semiconductor body; and
   a second gate adjacent to said first top surface and within said second divot adjacent to said second upper portion of said second sidewall.

6. An integrated circuit structure comprising:
   a substrate;
   a logic circuit on said substrate, said logic circuit comprising:
      a first transistor, having a first conductivity type, on said substrate, said first transistor comprising:
         a first semiconductor body having a first sidewall; and
         a first isolation region adjacent to said first sidewall, said first isolation region having a first divot positioned laterally immediately adjacent to a first upper portion of said first sidewall; and
      a second transistor, having a second conductivity type different from said first conductivity type, on said substrate, said second transistor comprising:
         a second semiconductor body having a second sidewall; and
         a second isolation region adjacent to said second sidewall, said second isolation region having a second divot positioned laterally immediately adjacent to a second upper portion of said second sidewall, said second divot having a greater depth than said first divot; and
   a plurality of analog devices on said substrate, said analog devices comprising:
      a third transistor, having said first conductivity type, on said substrate, said third transistor comprising:
         a third semiconductor body having a third sidewall; and
         a third isolation region adjacent to said third sidewall, said third isolation region having one of a third divot and no divot positioned laterally immediately adjacent to a third upper portion of said third sidewall; and
      a fourth transistor, having said second conductivity type, on said substrate, said fourth transistor comprising:
         a fourth semiconductor body having a fourth sidewall;
         a fourth isolation region adjacent to said fourth sidewall, said fourth isolation region having one of a fourth divot and no divot positioned laterally immediately adjacent to a fourth upper portion of said fourth sidewall,
   said second divot having a greater depth than said third divot, when said third isolation region has said third divot positioned laterally immediately adjacent to said third upper portion of said third sidewall,
   said second divot having a greater depth than said fourth divot, when said fourth isolation region has said fourth divot positioned laterally immediately adjacent to said fourth upper portion of said fourth sidewall, and
   any divots in said first isolation region, said third isolation region and said fourth isolation region having approximately equal depths.

7. The integrated circuit structure according to claim 6, said first transistor and said third transistor comprising n-type transistors.

8. The integrated circuit structure according to claim 6, said second transistor and said fourth transistor comprising p-type transistors.

9. The integrated circuit structure according to claim 6, said first sidewall, said second sidewall, said third sidewall and said fourth sidewall each having a same crystalline orientation.

10. The integrated circuit structure according to claim 9, further comprising:
   a first horizontal channel region at a first top surface of said first semiconductor body;
   a first gate adjacent to said first top surface;
   a second horizontal channel region at a second top surface of said second semiconductor body;
   a second vertical channel region at a second upper portion of said second sidewall of said second semiconductor body;
   a second gate adjacent to said second top surface and within said second divot adjacent to said second upper portion of said second sidewall;

a third horizontal channel region at a third top surface of said third semiconductor body;
a third gate adjacent to said third top surface;
a fourth horizontal channel region at a forth top surface of said fourth semiconductor body; and
a fourth gate adjacent to said fourth top surface.

11. An integrated circuit structure comprising:
a substrate;
a logic circuit on said substrate, said logic circuit comprising:
   a first transistor, having a first conductivity type, on said substrate, said first transistor comprising:
      a first semiconductor body having a first sidewall; and
      a first isolation region adjacent to said first sidewall, said first isolation region having a first divot positioned laterally immediately adjacent to a first upper portion of said first sidewall; and
   a second transistor, having a second conductivity type different from said first conductivity type, on said substrate, said second transistor comprising:
      a second semiconductor body having a second sidewall; and
      a second isolation region adjacent to said second sidewall, said second isolation region having a second divot positioned laterally immediately adjacent to a second upper portion of said second sidewall, said second divot having a greater depth than said first divot; and
a memory circuit on said substrate, said memory circuit comprising:
   a fifth transistor, having said first conductivity type, on said substrate, said fifth transistor comprising:
      a fifth semiconductor body having a fifth sidewall; and
      a fifth isolation region adjacent to said fifth lower portion, said fifth isolation region having a fifth divot adjacent to a fifth upper portion of said fifth sidewall; and
   a sixth transistor, having said second conductivity type, on said substrate, said sixth transistor comprising:
      a sixth semiconductor body having a sixth sidewall; and
      a sixth isolation region adjacent to said sixth sidewall, said sixth isolation region having a sixth divot adjacent to a sixth upper portion of said sixth sidewall, said sixth divot, said fifth divot and said second divot having approximately equal depths.

12. The integrated circuit structure according to claim 11, said first transistor and said fifth transistor comprising n-type transistors.

13. The integrated circuit structure according to claim 11, said second transistor and said sixth transistor comprising p-type transistors.

14. The integrated circuit structure according to claim 11, said first sidewall, said second sidewall, said fifth sidewall and said sixth sidewall each having a same crystalline orientation.

15. The integrated circuit structure according to claim 11, further comprising:
a first horizontal channel region at a first top surface of said first semiconductor body;
a first gate adjacent to said first top surface;
a second horizontal channel region at a second top surface of said second semiconductor body;
a second vertical channel region at a second upper portion of said second sidewall of said second semiconductor body; and
a second gate adjacent to said first top surface and within said second divot adjacent to said second upper portion of said second sidewall.

* * * * *